(12) United States Patent
Stoller

(10) Patent No.: US 6,392,896 B1
(45) Date of Patent: May 21, 2002

(54) SEMICONDUCTOR PACKAGE CONTAINING MULTIPLE MEMORY UNITS

(75) Inventor: Herbert I. Stoller, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,372

(22) Filed: Dec. 22, 1999

(51) Int. Cl.[7] .................... H05K 7/02; H05K 7/06; H05K 7/08; H05K 1/14; H01R 13/62
(52) U.S. Cl. .................... 361/760; 361/803; 439/329
(58) Field of Search ................... 361/760, 381, 361/788, 784, 785, 789, 709, 803; 437/206, 209; 439/329; 257/686

(56) References Cited

U.S. PATENT DOCUMENTS

| | | | |
|---|---|---|---|
| 4,739,446 A | 4/1988 | Landis | 361/385 |
| 5,034,349 A | 7/1991 | Landis | 437/206 |
| 5,397,747 A | 3/1995 | Angiulli et al. | 437/209 |
| 5,530,623 A | 6/1996 | Sanwo et al. | 361/788 |
| 6,059,173 A * | 5/2000 | Mays et al. | 228/180.22 |
| 6,115,260 A * | 9/2000 | Nakajima et al. | 361/760 |

OTHER PUBLICATIONS

B. Agusta, et al. "High–Density Packaging of Monolithic Circuits", IBM Technical Disclosure Bulletin, vol. 10, No. 7, Dec. 1967, pp. 890–891.

R Henle, "Vertical Chip Packaging", IBM Technical Disclosure Bulletin, vol. 20, No. 11A, Apr. 1978, pp. 4339–4340.

K. Hermann, et al. "Vertically Mounted Module", IBM Technical Disclosure Bulletine, vol. 27, No. 3, Aug. 1984, pp. 1599–1600.

* cited by examiner

Primary Examiner—Brian Sircus
Assistant Examiner—Chandrika Prasad
(74) Attorney, Agent, or Firm—Ira David Blecker

(57) ABSTRACT

A semiconductor package in which a memory module (a SIMM or DIMM, for example) is mounted edgewise on a ceramic substrate. In another embodiment, a semiconductor package in which a chip scale package is mounted edgewise on a ceramic substrate.

12 Claims, 4 Drawing Sheets

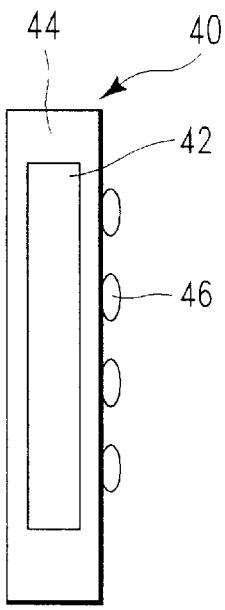
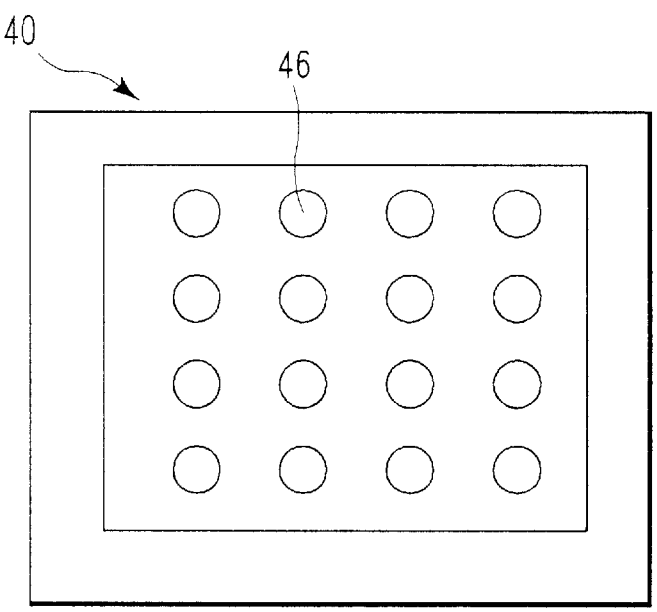
(PRIOR ART)
FIG. 5A
(PRIOR ART)
FIG. 5B
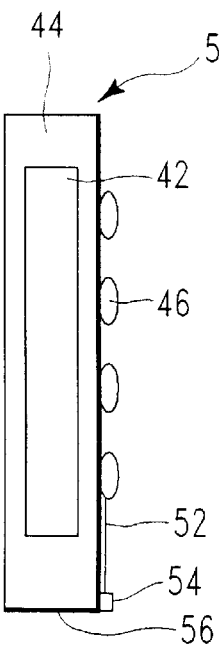
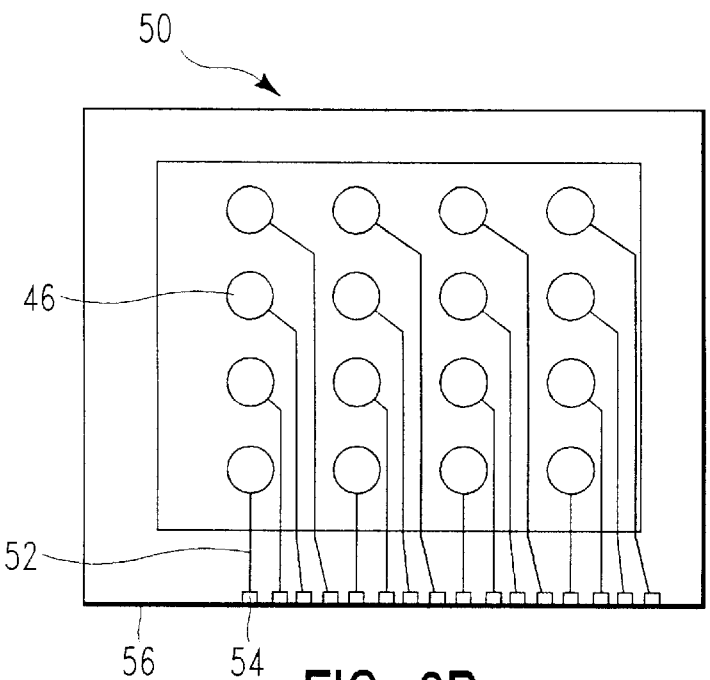
FIG. 6A
FIG. 6B

SEMICONDUCTOR PACKAGE CONTAINING MULTIPLE MEMORY UNITS

BACKGROUND OF THE INVENTION

The present invention relates to memory systems for computer systems and, more particularly, relates to semiconductor packages containing multiple memory units on the same ceramic substrate.

Present lay digital computer systems include multiple printed circuit boards on which various integrated and discrete components are mounted as well as other printed circuit boards and single-chip or multi-chip modules. One of these printed circuit boards is called the motherboard. The motherboard usually receives the other printed circuit boards, various integrated and discrete components and the single-chip or multi-chip modules.

In today's more advanced computer systems, the single-chip and multi-chip modules consist of a microprocessor or microprocessors, application specific integrated circuit (ASIC) or other logic device, soldered on a ceramic substrate by controlled collapse chip connections or the like. The module may also contain a cache chip which provides a limited amount (1 megabyte or less) of high speed memory.

Computer memory, specifically random access memory (RAM), often consists of one or more memory modules, such as single in-line memory (SIMM) or dual in-line memory (DIMM) boards which plug into the motherboard or a separate memory board. Such motherboard and separate memory board are made of an organic material such as epoxy impregnated fiberglass. Each memory module may contain one, four or more megabytes of memory. Several memory module sockets are typically provided, not all of which are necessarily occupied. Thus the user can configure the memory system in accordance with the requirements of the computer system, and add additional memory modules, or larger capacity modules, should the memory demands of the system increase.

As computer system speeds and memory requirements increase, computer main memory capacity and complexity have increased. Traditional memory packaging arrangements are becoming inadequate as the disparity between on-chip memory speed and inter-chip communication speed increases.

It would be desirable to have an improved memory packaging arrangement. A number of schemes have been proposed for improving the packaging of memory systems.

Landis U.S. Pat. No. 4,739,446, the disclosure of which is incorporated by reference herein, discloses a connector assembly having pins on the edge for vertically plugging into a board or other connector. The pins extend through the connector assembly to contact a wafer scale assembly.

Landis U.S. Pat. No. 5,034,349, the disclosure of which is incorporated by reference herein, discloses a connector assembly in which a tab connector fans out a metal connection from a bare die silicon chip to an external connector in a planar arrangement.

Angiulli et al. U.S. Pat. No. 5,397,747, the disclosure of which is incorporated by reference herein, discloses a vertical chip mount memory package in which a collection of bare die chip cubes are connected on their edges to a printed circuit board motherboard.

Sanwo et al. U.S. Pat. No. 5,530,623, the disclosure of which is incorporated by reference herein, discloses a high speed memory packaging scheme in which SIMMs and DIMMs are received in connectors which are mounted to a printed circuit board motherboard.

Agusta et al. IBM Technical Disclosure Bulletin, 10, No. 7, pp. 890–891 (December 1967), the disclosure of which is incorporated by reference herein, discloses a high density packaging scheme in which chips mounted on carriers are joined on edge to a module substrate.

Henle IBM Technical Disclosure Bulletin, 20, No. 11A, pp. 4339–4340 (April 1978), the disclosure of which is incorporated by reference herein, discloses a vertical chip packaging scheme in which bare die chips are connected on edge to a substrate by foil strips.

Hermann et al. IBM Technical Disclosure Bulletin, 27, No. 3, pp. 1599–1600 (August 1984), the disclosure of which is incorporated by reference herein, discloses a vertically mounted module in which a set of bare die chips are attached to a SIMM or DIMM which is then soldered directly to a card In view of the above prior art attempts at improving memory packaging, it is accordingly a purpose of the present invention to have a memory packaging arrangement with increased performance.

It is another purpose of the present invention to mount the memory modules on a ceramic substrate.

It is yet another purpose of the present invention to have a memory packaging arrangement in which the memory modules and microprocessor, ASIC or other logic device are mounted on the same ceramic substrate.

These and other purposes of the present invention will become more apparent after referring to the following description considered in conjunction with the accompanying drawings.

BRIEF SUMMARY OF THE INVENTION

According to a first aspect of the present invention, there is a semiconductor package comprising:
- a ceramic substrate;
- a planar card having a principal flat surface and at least one edge;
- a plurality of memory units mounted on the principal flat surface of the planar card; and
- wherein the planar card is mounted edgewise on the ceramic substrate.

According to a second aspect of the present invention, there is a semiconductor package comprising:
- a ceramic substrate;
- a chip scale package having a first plurality of I/O connections on a surface of the chip scale package and a second plurality of I/O connections on the surface, and at an edge, of the chip scale package, the first and second plurality of I/O connections being connected on the surface of the chip scale package, the chip scale package being mounted edgewise on the ceramic substrate through the second plurality of I/O connections.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 5A and 5B are side and plan views, respectively, of a prior art chip scale package.

FIGS. 6A and 6B, are side and plan views, respectively, of a chip scale package according to the present invention.

DETAILED DESCRIPTION OF THE INVENTION

Conventional ceramic carriers, either single-chip modules or multi-chip modules, have semiconductor devices or chips (semiconductor devices and chips will be used interchangeably hereafter) attached directly to the ceramic substrates in a planar fashion. That is, one of the large surfaces of the semiconductor device is mounted face down. One of the problems with this type of planar connection is that it limits the number of semiconductor devices that can be supported on the ceramic carrier. This type of planar connection also makes the removal and replacement of semiconductor devices difficult.

Previously, conventional vertical memory components like SIMMs and DIMMs were mounted on an organic card. Ceramic carriers allow signals to be packed denser than organic cards, thereby decreasing signal delay. The present invention allows the connection of such conventional vertical components directly to a ceramic chip carrier through the use of a connector or a soldered connection. Such an arrangement can dramatically increase the density of semiconductor devices that can be supported on a ceramic carrier of a given size. The increase in chip carrying capacity can dramatically increase the performance and function of a given ceramic carrier and/or significantly lower the manufacturing costs of the package. It further permits the facile removal and replacement of components. Moreover, having such vertical components close to the logic device decreases memory access time. Memory access time is further reduced by having such vertical components and logic device on the same ceramic chip carrier.

Figure 1:
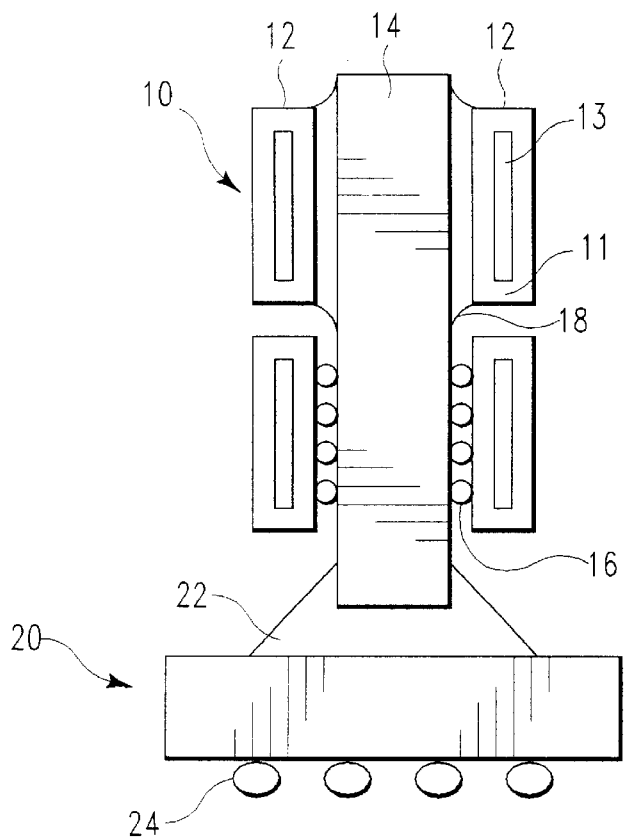
FIG. 1 is a view of a memory module mounted in a connector.

Referring to the Figures in more detail, and particularly referring to FIG. 1, there is shown a memory module 10 having a plurality of chip packages 12 joined to a card 14. Each of the chip packages 12 consists of a semiconductor device 13, typically a memory device, which is encapsulated in material 11. The chip packages 12 may be joined to the card 14 by solder elements 16 or legs 18 pendent from the chip package 12 which are then soldered to the card 14.

The card 14 may be made from an organic material, such as epoxy impregnated fiberglass, also known as FR-4, or a ceramic material such as alumina. For purposes of the embodiment of the invention shown in FIG. 1, any conventional material is suitable for card 14.

Also shown in FIG. 1 is connector 20 which consists of receiving portion 22 and solder elements 24. Memory module 10 is vertically received in receiving portion 22 of connector 20.

The solder elements referenced herein can be any fusible material including conventional metallic solders as well as conductive polymers and metal-loaded polymers.

Figure 2:
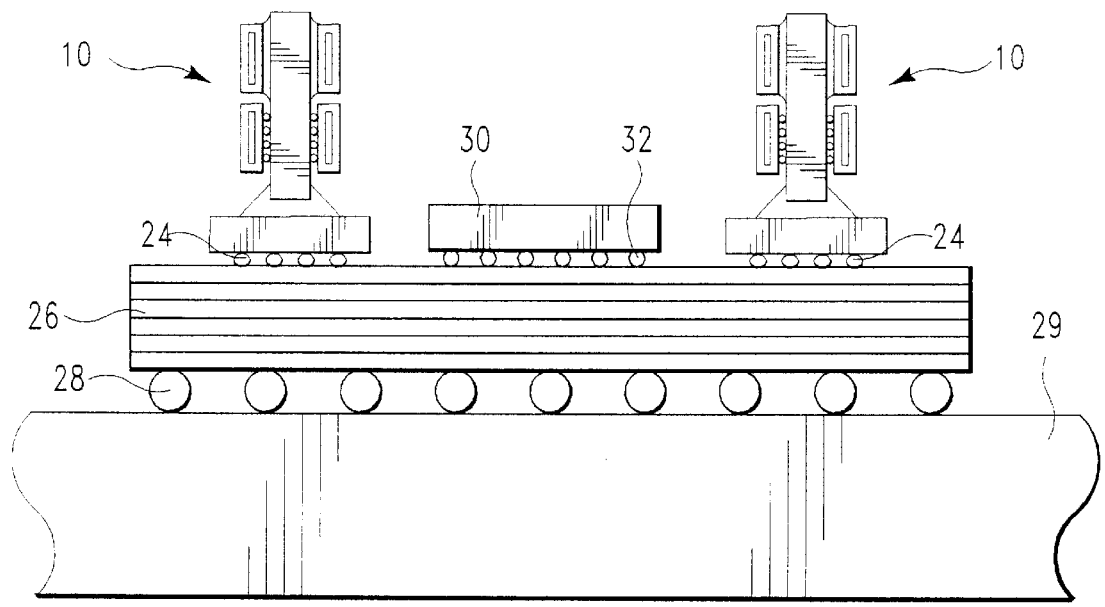
FIG. 2 is a view of a plurality of memory modules vertically mounted on a ceramic substrate by the connectors shown in FIG. 1.

Thereafter, as shown in FIG. 2, a plurality of memory modules 10 are soldered through solder elements 24 of connector 20 to ceramic substrate 26. Ceramic substrate 26 may be any conventional ceramic material that is used in the electronics industry and may include, for example, alumina, glass-ceramic, glass plus ceramic, aluminum nitride, glass, etc., just to name a few. Ceramic substrate 26 has solder elements 28 which are used to join the ceramic substrate to the next level of packaging, typically a motherboard 29. As the stress between the connector 20 and ceramic substrate 26 depends on the length of the connector 20 and the temperature difference between the connector 20 and ceramic substrate 26, to avoid excess stress between the connector 20 and ceramic substrate 26, the connector 20 should be made of a material (ceramic or plastic) that has a thermal coefficient of expansion (TCE) close to or the same as the ceramic substrate.

Still referring to FIG. 2, at least one non-memory semiconductor device 30, such as a microprocessor, ASIC or other logic device, may be joined to ceramic substrate 26 by solder elements 32. The logic device may have some embedded memory but it is primarily a logic device.

As can be appreciated, memory modules 10 mounted on ceramic substrate 26 provide a large amount of cache-like memory close to the semiconductor device 30 for improved performance. Due to the vertical orientation of the memory modules 10, a substantial amount of memory (e.g., 64 megabytes or more) may be placed close to the semiconductor device 30. This should be compared to the 1 megabyte or so of cache memory that is often present with today's microprocessors. In the latter situation, the memory is mounted in a planar fashion on the surface of the ceramic substrate 26 so the amount of memory that can be placed on the ceramic substrate according to the prior art would be necessarily limited to an amount less than that possible with the present invention.

Figure 3:
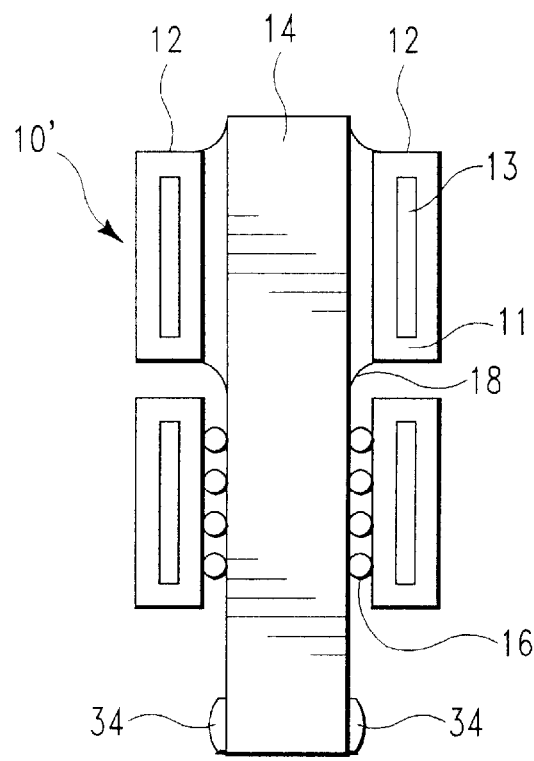
FIG. 3 is a view of a memory module prepared for soldering to a ceramic substrate.
Figure 4:
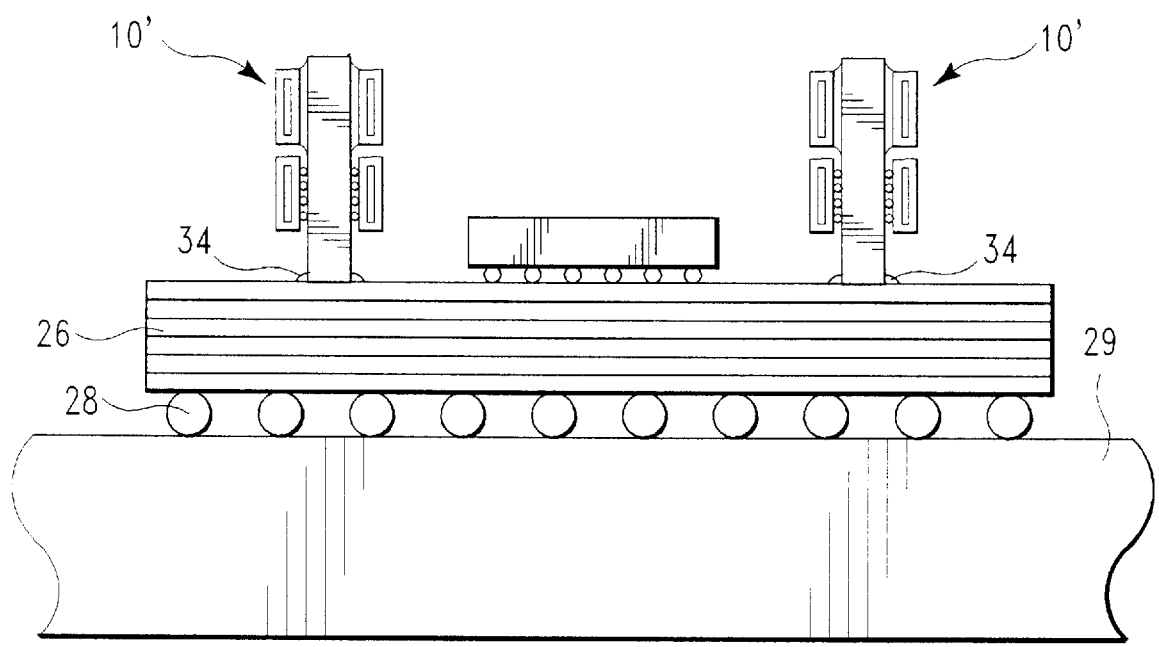
FIG. 4 is a view of a plurality of memory modules shown in FIG. 3 vertically soldered to a ceramic substrate.

Referring now to FIGS. 3 and 4, there is shown a second embodiment of the present invention. As best seen in FIG. 3, memory module 10' has solder portions 34 which are used in soldering memory module 10' directly to ceramic substrate 26. The soldered memory modules 10' have a vertical orientation with respect to the ceramic substrate 26, as seen in FIG. 4, which is effective in attaining the advantages of the present invention.

The embodiment shown in FIGS. 3 and 4 is similar to the embodiment shown in FIGS. 1 and 2 except that in the embodiment of FIGS. 3 and 4, memory module 10' is soldered directly to the ceramic substrate whereas the embodiment of FIGS. 1 and 2 required a connector. Since card 14 is in direct contact with ceramic substrate 26, it should be made of a material (ceramic or plastic) that has a TCE the same or close to that of ceramic substrate 26.

Referring now to FIGS. 5A and 5B, there is shown a conventional chip scale package. A chip scale package is an area array package which is no more than about 25% larger than the semiconductor device. In the chip scale package 40 of FIG. 5A, a semiconductor device 42 (usually a memory device but could also be a logic device) is encapsulated by packaging material 44 which may be, for example, a molded plastic. The chip scale package 40 also has solder elements 46 which are used to connect the chip scale package to a chip carrier. Referring to FIG. 5B, it can be seen that the solder elements 46 are arrayed over the face of the chip scale package 40 so that when joined to the chip carrier, the chip scale package would be arranged in a planar fashion on the chip carrier.

Referring now to FIGS. 6A and 6B, there is shown a chip scale package 50 according to the present invention. Chip scale package 50 contains a semiconductor device 42 which is encapsulated by packaging material 44 and has solder elements 46. However, the present chip scale package 50 has wiring traces 52 which connect the solder elements 46 to pads 54 located on the edge 56 of the chip scale package. According to the present invention, solder elements 46 would be used to temporarily connect the chip scale package 50 to a substrate or socket for burn-in while pads 54 would be used to permanently mount the chip scale package to a ceramic substrate.

Figure 7:
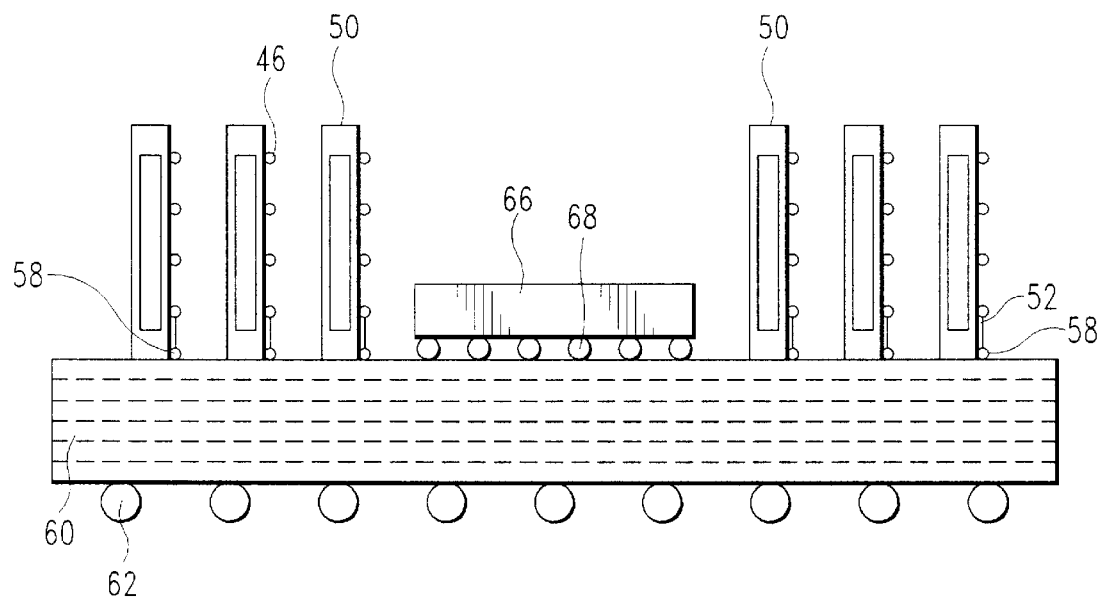
FIG. 7 is a view of a plurality of chip scale packages of FIGS. 6A and 6B vertically soldered to a ceramic substrate.

The chip scale packages 50 can then be soldered directly to ceramic substrate 60 by solder 58, as shown in FIG. 7, thereby achieving the vertical orientation that is desirable for enhanced density and performance. Ceramic substrate 60 has, for example, solder elements 62 which are used for joining the ceramic substrate 60 to the next level of packaging such as a motherboard (not shown). The same materials used for ceramic substrate 26 can be used for ceramic substrate 60. Typically, there will also be a semiconductor device 66 joined to ceramic substrate 60 by solder elements 68. Semiconductor device 66 preferably is a microprocessor, ASIC or other logic device.

Figure 8:
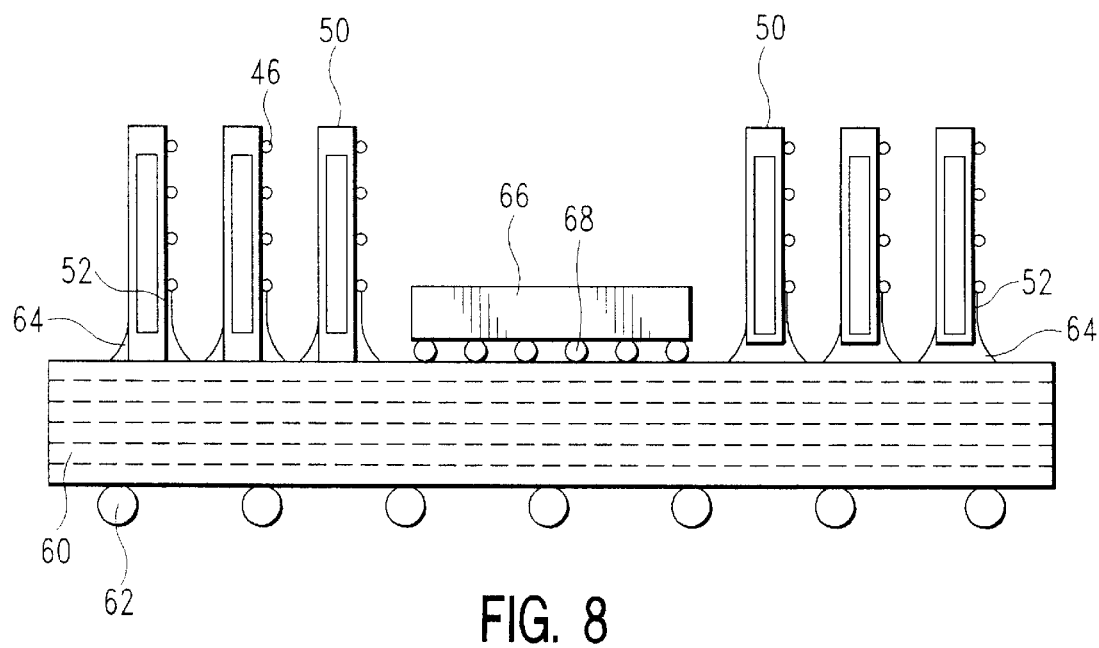
FIG. 8 is a view of a plurality of chip scale packages of FIGS. 6A and 6B vertically mounted in a connector which is then joined to a ceramic substrate.

As an alternative to the soldering of the chip scale packages 50 to the ceramic substrate 60 illustrated in FIG. 7, the chip scale packages 50 may be mounted on ceramic substrate 60 through connectors 64 as shown in FIG. 8. Connectors 64 are similar to connectors 20 shown in FIGS. 1 and 2 except that connectors 64 are somewhat smaller. Again, the TCE of connectors 64 should be the same or close to that of ceramic substrate 60.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A semiconductor package comprising:
   a ceramic substrate having solder elements and constituting a level of packaging for joining the ceramic substrate to a next level of packaging;
   a planar card having a principal flat surface and at least one edge;
   a plurality of memory units mounted on the principal flat surface of the planar card; and
   wherein the planar card is mounted edgewise on the ceramic substrate.

2. The semiconductor package of claim 1 further comprising a connector receiving the at least one edge of the planar card, the connector being soldered to the ceramic substrate.

3. The semiconductor package of claim 1 wherein the planar card is soldered directly to the ceramic substrate.

4. The semiconductor package of claim 1 further comprising a non-memory semiconductor device mounted directly on the ceramic substrate.

5. The semiconductor package of claim 1 wherein the plurality of memory units are soldered to the planar card.

6. The semiconductor package of claim 3 wherein the planar card comprises material that has a thermal coefficient of expansion matching that of the ceramic substrate.

7. The semiconductor package of claim 2 wherein the planar card has a thermal coefficient of expansion higher than that of the ceramic substrate and the connector has a thermal coefficient of expansion between that of the ceramic substrate and the planar card.

8. A semiconductor package comprising:
   a ceramic substrate;
   a chip scale package having a first plurality of I/O connections on a surface of the chip scale package and a second plurality of I/O connections on the surface, and at an edge, of the chip scale package, the first and second plurality of I/O connections being connected on the surface of the chip scale package, the chip scale package being mounted edgewise on the ceramic substrate through the second plurality of I/O connections.

9. The semiconductor package of claim 8 further comprising a connector receiving the edge of the chip scale package, the connector being soldered to the ceramic substrate.

10. The semiconductor package of claim 8 wherein the chip scale package is soldered directly to the ceramic substrate.

11. The semiconductor package of claim 8 further comprising a non-memory semiconductor device mounted directly on the ceramic substrate.

12. The semiconductor package of claim 9 wherein the connector has a thermal coefficient of expansion matching that of the ceramic substrate.

* * * * *